(12) United States Patent
Lai

(10) Patent No.: US 9,437,671 B2
(45) Date of Patent: Sep. 6, 2016

(54) POWER AND SIGNAL EXTENDER AND RELATED CIRCUIT BOARD

(71) Applicant: NOVATEK Microelectronics Corp., Hsin-Chu (TW)

(72) Inventor: Chia-Ta Lai, Hsinchu (TW)

(73) Assignee: NOVATEK Microelectronics Corp., Hsin-Chu (TW)

( * ) Notice: Subject to any disclaimer, the term of this patent is extended or adjusted under 35 U.S.C. 154(b) by 0 days.

(21) Appl. No.: 14/630,652

(22) Filed: Feb. 25, 2015

(65) Prior Publication Data

US 2016/0156086 A1 Jun. 2, 2016

(30) Foreign Application Priority Data

Nov. 27, 2014 (TW) .............................. 103141270 A

(51) Int. Cl.
 *H04B 3/28* (2006.01)
 *H01L 29/00* (2006.01)
 *H01P 3/08* (2006.01)

(52) U.S. Cl.
 CPC ........ *H01L 29/00* (2013.01); *H01P 3/08* (2013.01)

(58) Field of Classification Search
 CPC .................................. H01P 3/08; H01L 29/00
 USPC ............................................................ 333/12
 See application file for complete search history.

(56) References Cited

U.S. PATENT DOCUMENTS

2006/0066416 A1* 3/2006 Nicholson ............... H01L 23/04
 333/32

FOREIGN PATENT DOCUMENTS

TW 201114000 4/2011
TW 201407699 A 2/2014

* cited by examiner

*Primary Examiner* — Robert Pascal
*Assistant Examiner* — Kimberly Glenn
(74) *Attorney, Agent, or Firm* — Winston Hsu; Scott Margo

(57) ABSTRACT

A power and signal extender, which is utilized on a circuit board for preventing a power or a signal on the circuit board from influencing an integrity of a ground plane on the circuit board, includes a first pin, coupled to a first transmission wire of the circuit board, for receiving the power or the signal from the first transmission wire; and a second pin, coupled to a second transmission wire of the circuit board, for outputting the power or the signal to the second transmission wire.

8 Claims, 3 Drawing Sheets

POWER AND SIGNAL EXTENDER AND RELATED CIRCUIT BOARD

BACKGROUND OF THE INVENTION

1. Field of the Invention

The present invention relates to a power and signal extender and a circuit board, and more particularly, to a power and signal extender and a circuit board capable of maintaining the ground plane integrity of the circuit board.

2. Description of the Prior Art

The printed circuit board (PCB), which is the most widely utilized circuit device at the present time, is utilized as a supporter of various electronic elements and provides circuit connections between different electronic elements. During the production process of PCB, a predefined circuit may be realized on the PCB via specific production steps such as development and etching. The active elements and/or passive elements on the PCB maybe incorporated with different circuit structures to realize the functions required by various electronic products.

Most of common PCBs have multiple-layer structures, and there are via holes deployed on the PCBs, so that circuits may transmit between different layers through the via holes. An ideal PCB has advantages such as well heat dissipation, high signal stability, low electromagnetic interference (EMI) and excellent electrostatic discharge (ESD) protection capability. However, due to the requirements of cost reduction, modern electronic products are always implemented with PCB having fewer layers (e.g., a double layer board), resulting in losses of signal stability, heat dissipation capability, EMI performance, ESD protection capability of the PCB. For example, the common signal deployment for a double layer board structure is that power and various signals are deployed on the upper layer, and that the system ground is deployed on the lower layer. When there are two different signal wires crossing over each other, one of the signal wires may change to pass through the lower layer from a via hole. Therefore, an area on the lower layer should be segmented from the ground plane for the deployment of signal wire, resulting in imperfection of the ground plane. If there are more numbers of signals having to pass through the lower layer, more areas should be segmented from the ground plane located on the lower layer, for transmissions of the signals. The ground plane will therefore become fragmentary. The fragmentation of ground plane will give rise to more problems, such as discontinuous impedance, worse heat dissipation capability, more severe EMI problem and worse ESD protection capability.

For example, please refer to FIG. 1, which is a schematic diagram of circuit structure of a double layer board 10. As shown in FIG. 1, the double layer board 10 includes a package 100, circuit devices 102, 104 and a power supply module 106. An integrated circuit (IC) 108, which is included in the package 100, is utilized for performing specific functions. Signals between the IC 108 and other devices or modules on the double layer board 10 may be transmitted via transmission wires W1-W3. The power supply module 106 supplies a first power P1 for usage of the IC 108 and the circuit devices 102, 104. The IC 108 further obtains a second power P2 from the power supply module 106, for performing several specific applications.

In the double layer board 10, most power and signal wires are deployed on the upper layer and the ground plane is deployed on the lower layer. The ground plane should possess its integrity, which allows the double layer board 10 to have enough stability and heat dissipation capability, and further have enough capability against the EMI and ESD. In several conditions, however, the power or signal wires located on the upper layer should still pass through the lower layer. For example, as shown in FIG. 1, the transmission path of the first power P1 to the circuit device 102 is interrupted by the transmission wire W1; hence, the first power P1 may pass through the via hole to the lower layer and change to be transmitted on the lower layer (or the transmission wire W1 may be transmitted to the lower layer). The transmission path of the first power P1 to the circuit device 104 is also interrupted by the second power P2, where the first power P1 also pass through the via hole to the lower layer and change to be transmitted on the lower layer (or the second power P2 may be transmitted to the lower layer). However, the transmission of the first power P1 on the lower layer of the double layer board 10 must segment the area of ground plane located on the lower layer, which causes imperfection of the ground plane and thereby generates the problems such as discontinuous impedance, worse heat dissipation capability, more severe EMI problem and worse ESD protection capability as mentioned above.

In order to solve the above problem, more costs are always required. For example, a PCB designer may apply a large heat sink to solve the heat dissipation problem, or add an ESD protection device on the PCB to enhance the ESD protection capability. In such a situation, the low cost benefits of the PCB having fewer layers will disappear. Thus, there is a need for improvement over the prior art.

SUMMARY OF THE INVENTION

It is therefore an objective of the present invention to provide a power and signal extender, which is capable of maintaining the integrity of ground plane on the circuit board, where power or signal wires may pass through a power and signal extender instead of the lower layer of the circuit board, in order to prevent the ground plane located on the lower layer from becoming fragmentary when the power or signal wires pass through. In addition, the power and signal extender may be integrated into any active element(s) or passive element(s) on the circuit board, and use redundant pins of the available element(s) for power or signal transmission, in order to realize the power or signal transmission on the upper layer of the circuit board and the power and signal extender without increasing the cost.

The present invention discloses a power and signal extender on a circuit board, for preventing a power or a signal on the circuit board from influencing an integrity of a ground plane on the circuit board. The power and signal extender comprises a first pin, coupled to a first transmission wire of the circuit board, for receiving the power or the signal from the first transmission wire; and a second pin, coupled to a second transmission wire of the circuit board, for outputting the power or the signal to the second transmission wire.

The present invention further discloses a circuit board, which comprises a first transmission wire, for transmitting a power or a signal; a second transmission wire, for transmitting the power or the signal; and a power and signal extender, for preventing the power or the signal from influencing an integrity of a ground plane on the circuit board. The power and signal extender comprises a first pin, coupled to the first transmission wire, for receiving the power or the signal from the first transmission wire; and a second pin, coupled to the second transmission wire, for outputting the power or the signal to the second transmission wire.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
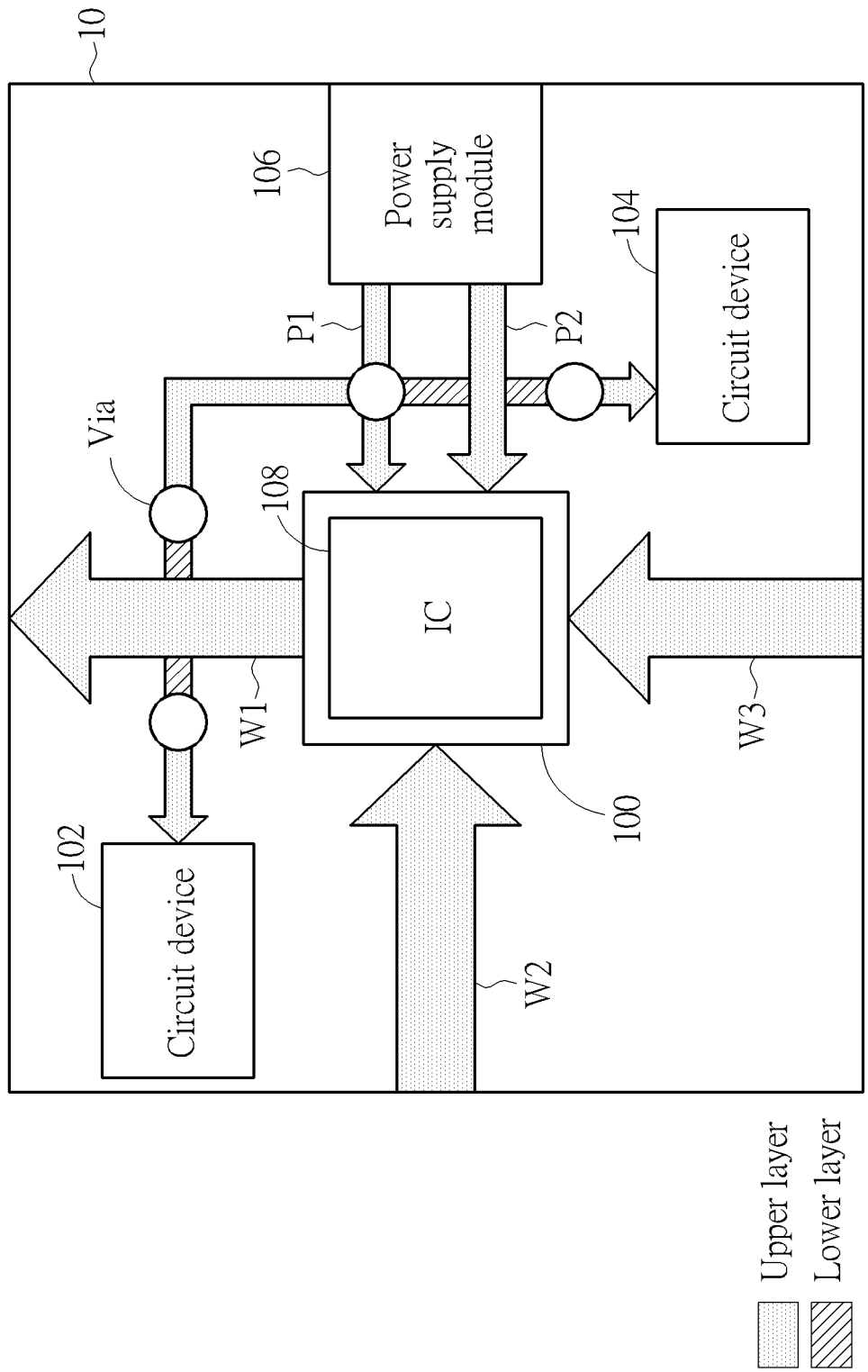
FIG. 1 is a schematic diagram of circuit structure of a double layer board.
Figure 2:
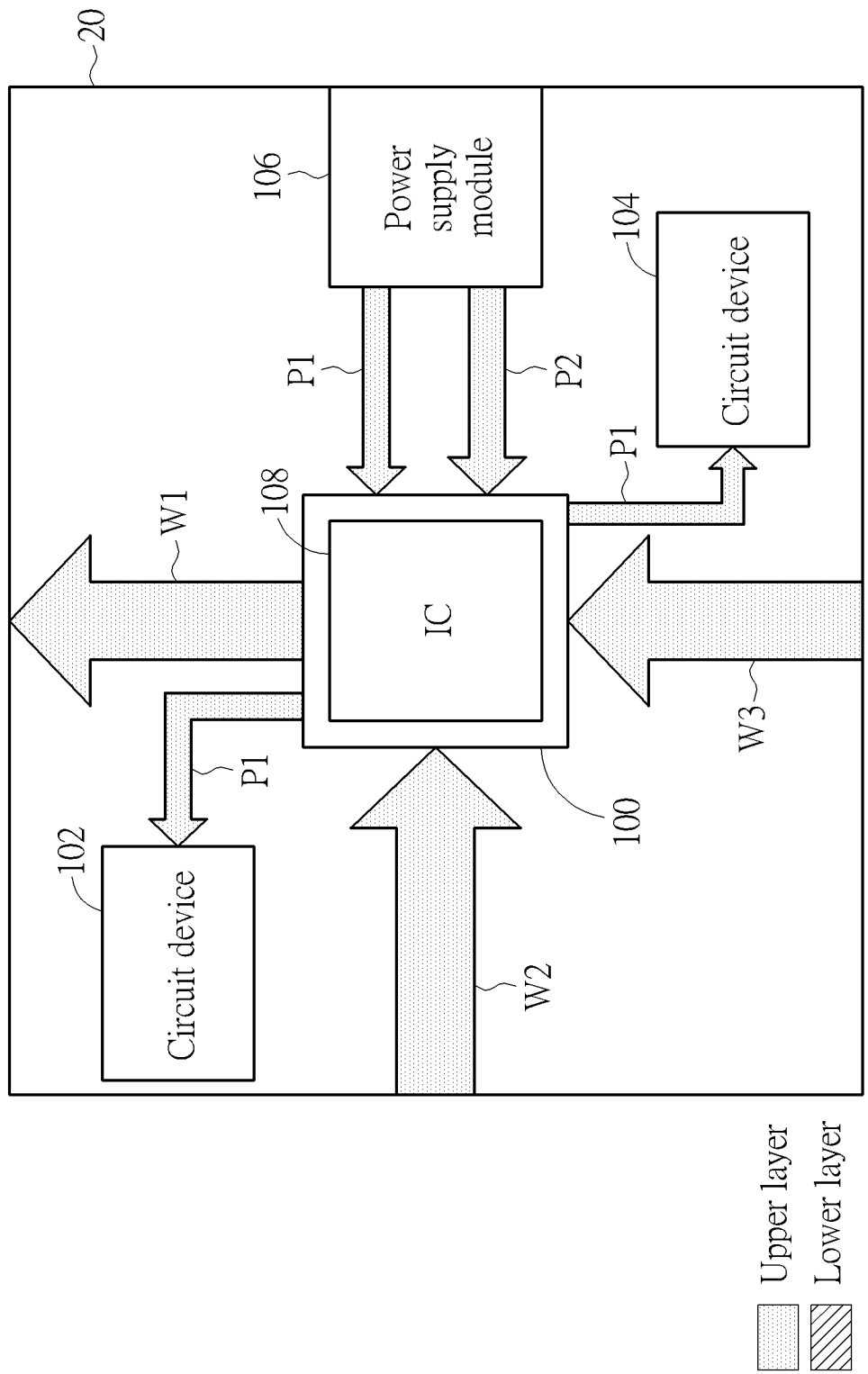
FIG. 2 is a schematic diagram of circuit deployment of a double layer board according to an embodiment of the present invention.

The method provided by the present invention may prevent or reduce the condition where the power or signal wires originally located on the upper layer segment the ground plane located on the lower layer. Please refer to FIG. 2, which is a schematic diagram of circuit deployment of a double layer board 20 according to an embodiment of the present invention. As shown in FIG. 2, the deployment way of devices and modules on the double layer board 20 is the same as the deployment way on the double layer board 10, and the deployment way of power and signal circuits is similar; hence, devices and signals having the same functions are denoted by the same symbols. The main difference between the double layer board 20 and the double layer board 10 is that the first power P1 on the double layer board 20 does not need to be transmitted via the lower layer; instead, the first power P1 on the double layer board 20 is first transmitted to the package 100 from the power supply module 106, and then passes through the pins of the package 100 to arrive the circuit devices 102 and 104. As a result, the condition where the power or signal wires segment the ground plane to make the ground plane imperfection may be significantly reduced or prevented to happen.

Figure 3:
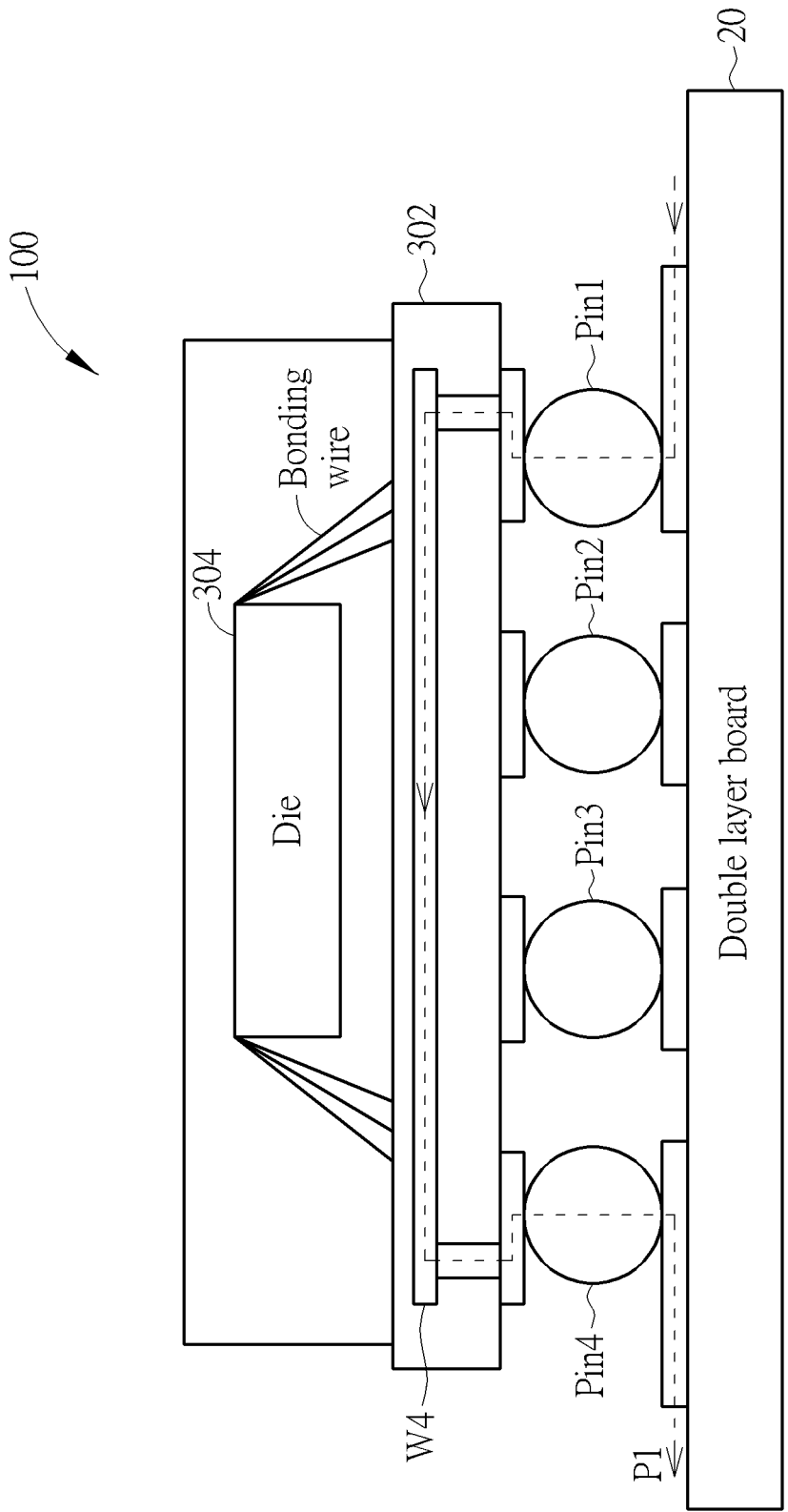
FIG. 3 is a schematic diagram of an implementation of the package.

In detail, please refer to FIG. 3, which is a schematic diagram of an implementation of the package 100. FIG. 3 illustrates a side view of a ball grid array (BGA) structure, which includes a substrate 302, a die 304 and sphere pins Pin1-Pin4. The package 100 is disposed on the double layer board 20, and welded to the double layer board 20 via the sphere pins Pin1-Pin4. The substrate 302 is utilized for carrying the die 304 and its internal circuits. The substrate 302 includes a transmission wire W4, for transmitting power or signals. The die 304 may include the integrated circuit (IC) 108, of which the internal circuits may be coupled to the substrate 302 via bonding wires and further coupled to the double layer board 20 via the sphere pins Pin1-Pin4. In general, an active element or a passive element may be included in the die 304, where the active element may be any type of IC and the passive element may be a capacitor or resistor; this is not limited herein.

As mentioned above, the first power P1 shown in FIG. 2 is transmitted to the circuit devices 102 and 104 via the package 100. According to the structure of the package 100, the first power P1 may be generated from the double layer board 20 and enter the package 100 via the sphere pin Pin1, then pass through the transmission wire W4 on the substrate 302 to the sphere pin Pin4, and then outputted to the double layer board 20 via the sphere pin Pin4. More specifically, if the first power P1 from the power supply module 106 needs to be transmitted to the circuit device 102 via the package 100, the sphere pin Pin1 of the package 100 may be deployed on the right-hand side of the package 100 shown in FIG. 2, in order to receive the first power P1; the sphere pin Pin4 may be deployed on the upper left side of the package 100 shown in FIG. 2, in order to output the first power P1. In addition, if the first power P1 needs to be transmitted to both of the circuit devices 102 and 104, there may be two sphere pins deployed to output the first power P1 to the circuit devices 102 and 104, respectively. Those skilled in the art should understand the method of outputting the first power P1 via two sphere pins according to the implementation of the package 100 shown in FIG. 3; this will not be narrated herein.

Please note that the first power P1 is transmitted via the transmission wire W4 located on the substrate 302 in the package 100 without entering the die 304. In other words, no matter whether the IC 108 or other active or passive element is disposed inside the die 304, the first power P1 does not need to undergo any signal processing via the circuit element inside the die 304. The package 100 can thereby be regarded as an extender of the first power P1, for extending the transmission of the first power P1 and also preventing the first power P1 from passing through the lower layer of the double layer board 20 to influence the integrity of ground plane.

In an embodiment, the designer of a double layer board may reserve pins in the package for transmitting the power or signals required to pass through the package according to system requirements. For example, the sphere pins Pin1 and Pin4 may be pins unrequested by the operations of the IC 108 (or other active or passive element) inside the package 100. These pins may be reserved in the package 100 to form a path in the package 100 for transmitting the first power P1 according to the first power P1 which should pass through the package 100. In another embodiment, several ICs on the double layer board may include redundant pins, and the designer of the double layer board may use the redundant pins to transmit specific power or signals according to system requirements. This allows the specific power or signals to pass through the IC package, in order to prevent the power or signal from passing through the lower layer of the double layer board to influence the integrity of ground plane. In such a situation, the double layer board does not require additional circuit elements; hence, the effect of preventing the ground plane from being segmented and even fragmented by the power or signal wires may be achieved without increasing the cost.

Please note that the present invention provides a power and signal extender capable of maintaining the ground plane integrity of the circuit board. Those skilled in the art can make modifications and alternations accordingly. For example, the abovementioned power and signal extender is realized in a package, but in other embodiments, any circuit element or device located on the circuit board may be utilized as the power and signal extender, as long as the circuit element or device can be used for transmitting specific power or signals. This prevents the power or signals from segmenting the area of ground plane to influence the ground plane integrity when the power or signals pass through the lower layer. In addition, in the above embodiment, only the first power P1 needs to be transmitted via the power and signal extender, but in other embodiments, a circuit board may include one or more power and signal extenders, in order to transmit one or more power or signals, which may include various power signals, digital control signals and analog signals having different voltages. Further, several ground nodes (e.g., analog ground) distinct from the system ground plane may also be transmitted via the power and signal extender by the above method.

In addition, the circuit boards in the above embodiments are all double layer boards, of which the upper layer is utilized for deploying circuit elements and transmitting power and signals, and the lower layer is utilized for deploying the ground plane. In other embodiments, the circuit board may be, for example, a printed circuit board (PCB), a flexible printed circuit (FPC) or other type of circuit board. The number of layers on the circuit board may also be greater than two. Even if the circuit board has more layers, it may still require the usage of power and signal extender to prevent collisions of different signals. On the other hand, the package 100 illustrated in FIG. 3 has a BGA structure, but in other embodiments, the package may also apply other type of package structure, such as dual in-line package (DIP), quad flat package (QFP) or chip on board (COB), which is not limited herein.

To sum up, the present invention provides a power and signal extender for a circuit board capable of maintaining the ground plane integrity of the circuit board. In the embodiments of the present invention, the power or signals maybe transmitted by passing through the power and signal extender instead of passing through the lower layer of the circuit board, so that the ground plane located on the lower layer will not become imperfection due to segmentations of the power or signal wires. This prevents the circuit board from possible problems such as discontinuous impedance, worse heat dissipation capability, more severe electromagnetic interference (EMI) problem and worse electrostatic discharge (ESD) protection capability. In addition, the power and signal extender of the present invention may be integrated into any active element or passive element on the circuit board, and may use redundant pins in the package of available elements, in order to realize power or signal transmissions via the upper layer of the circuit board and the power and signal extender without using the lower layer of the circuit board, where cost increasing is also prevented.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A power and signal extender, on a circuit board, for preventing a power or a signal on the circuit board from influencing an integrity of a ground plane on the circuit board, the power and signal extender comprising:
    a first pin, coupled to a first transmission wire of the circuit board, for receiving the power or the signal from the first transmission wire; and
    a second pin, coupled to a second transmission wire of the circuit board, for outputting the power or the signal to the second transmission wire;
    wherein the circuit board is a double sided board, which comprises:
        a first layer, for deploying the first transmission wire and the second transmission wire for transmitting the power or the signal; and
        a second layer, for deploying the ground plane;
    wherein the power and signal extender is coupled to the first layer, so that the power or the signal passes through the power and signal extender rather than passing through the second layer.

2. The power and signal extender of claim 1, wherein the power and signal extender is inside a package, and the package comprises:
    a substrate;
    a third transmission wire, deployed on the substrate, for transmitting the power or the signal; and
    a die, deployed on the substrate;
    wherein the power and the signal do not pass through the die.

3. The power and signal extender of claim 2, wherein the package is utilized for an active element or a passive element, and the first pin and the second pin are not required for operations of the active element or the passive element and are reserved in the package as a transmission path for transmitting the power or the signal inside the power and signal extender.

4. The power and signal extender of claim 1, wherein the power and the signal do not undergo any signal processing in the power and signal extender.

5. A circuit board, comprising:
    a first transmission wire, for transmitting a power or a signal;
    a second transmission wire, for transmitting the power or the signal; and
    a power and signal extender, for preventing the power or the signal from influencing an integrity of a ground plane on the circuit board, the power and signal extender comprising:
        a first pin, coupled to the first transmission wire, for receiving the power or the signal from the first transmission wire; and
        a second pin, coupled to the second transmission wire, for outputting the power or the signal to the second transmission wire;
    wherein the circuit board is a double sided board, which comprises:
        a first layer, for deploying the first transmission wire and the second transmission wire for transmitting the power or the signal; and
        a second layer, for deploying the ground plane;
    wherein the power and signal extender is coupled to the first layer, so that the power or the signal passes through the power and signal extender rather than passing through the second layer.

6. The circuit board of claim 5, wherein the power and signal extender is inside a package, and the package comprises:
    a substrate;
    a third transmission wire, deployed on the substrate, for transmitting the power or the signal; and
    a die, deployed on the substrate;
    wherein the power and the signal do not pass through the die.

7. The circuit board of claim 6, wherein the package is utilized for an active element or a passive element, and the first pin and the second pin are not required for operations of the active element or the passive element and are reserved in the package as a transmission path for transmitting the power or the signal inside the power and signal extender.

8. The circuit board of claim 5, wherein the power and the signal do not undergo any signal processing in the power and signal extender.

* * * * *